United States Patent [19]

Witt

[11] 4,103,719

[45] Aug. 1, 1978

[54] UNIVERSAL LEAD FORMING TOOL FOR DUAL-IN-LINE INTEGRATED CIRCUIT PACKAGES

[76] Inventor: Wilbur W. Witt, 2517-A Suffolk Ave., High Point, N.C. 27260

[21] Appl. No.: 823,585

[22] Filed: Aug. 11, 1977

[51] Int. Cl.² ............................................. B21F 1/02
[52] U.S. Cl. ............................. 140/147; 72/DIG. 10
[58] Field of Search ................ 72/212, DIG. 10, 133; 140/147, 105

[56] References Cited

U.S. PATENT DOCUMENTS

| | | | |
|---|---|---|---|
| 2,878,841 | 3/1959 | Peterson et al. | 140/147 |
| 3,687,172 | 8/1972 | Suverkropp | 140/147 |
| 3,880,205 | 4/1975 | Linker et al. | 140/147 |
| 4,003,414 | 1/1977 | Halligan | 140/147 |

Primary Examiner—Lowell A. Larson
Attorney, Agent, or Firm—Peter L. Berger

[57] ABSTRACT

A manually operated universal tool for straightening the leads on Dual-In-Line integrated circuit packages so they may be placed more easily into printed circuit boards and sockets. The tool as disclosed can be operated with one hand and primarily includes a split forming rail which is adjustable for the different centers of 0.300, 0.400, 0.500, and 0.600 inch wide Dual-In-Line integrated circuit packages, two forming rollers which are adjustable to adapt to the different manufacturers' thickness of leads on the integrated circuit packages, and adjustment features for adapting to the different form factors and shapes of the lateral leads which protrude outward from the integrated circuit packages, and a base plate.

11 Claims, 14 Drawing Figures

UNIVERSAL LEAD FORMING TOOL FOR DUAL-IN-LINE INTEGRATED CIRCUIT PACKAGES

BACKGROUND OF THE INVENTION

This invention relates to a universal tool for forming the leads on Dual-In-Line integrated circuit (IC) packages to true center lines, and more particularly to such a tool which can be used manually with a single hand.

IC packages are finding increased and widespread use throughout the electronics industry due to their low cost, efficient operation and generally superior advantages. These IC's are generally connected to corresponding printed circuit (PC) boards by being soldered directly to the PC boards or by sockets which have been soldered to the PC boards. In each case, the IC packages have to be assembled to the PC board or socket with very expensive automatic insertion equipment or by manual operation.

The manufacturers of IC's have an option when they produce the packages to either bend the leads of the packages to true center lines of 0.300, 0.400, 0.500, or 0.600 inches or bend the leads outwardly up to 15° on each side of the package. The lead thickness has a tolerance of ±0.003 inches. When the manufacturer elects to bend the leads outwardly, the leads have to be very accurately straightened by hand to true position lines before they can be placed into either the PC board or socket. Normally, this straightening process is by trial and error and frequently leads are broken, rendering the IC worthless. This process is time consuming and costly. Moreover, the lead configuration is only standardized in one plane, that is, the longitudinal plane where each lead is on 0.100 inch centers. In the lateral plane, the lead form factor configuration takes many shapes.

An object of my invention is to provide a universal lead straightening tool for IC's which minimizes human error in the process of straightening the leads for insertion of the package into a PC board or socket.

Another object of my invention is to provide such a universal lead forming tool which may be used with all known existing manufactured IC packages which incorporate the Dual-In-Line principle, including the Dual Four-and-Up principle without any damage to the finish on the leads which would render them useless.

Another object of my invention is to provide such a universal lead straightening tool which can be conveniently and easily manipulated with a single hand.

Yet another object of my invention is to provide such a tool which can accomodate IC's of different widths (0.300, 0.400, 0.500, and 0.600 inch).

Yet another object of my invention is to provide such a tool which can accomodate different thicknesses of the leads of the IC packages.

Yet another object of my invention is to provide such a tool which can accomodate the different lateral configurations of the leads where they protrude from the sides of the IC packages.

Yet another object of my invention is to provide such a universal lead forming tool which may be easily, efficiently and inexpensively manufactured and which will find widespread distribution and use.

Other objects, advantages and features of this invention will become more apparent hereinafter.

SUMMARY OF THE INVENTION

In accordance with the principles of the invention, the above objects are accomplished by providing a novel manually operated lead forming tool for straightening the leads on Dual-In-Line IC packages without damaging the leads, so that they may be placed into PC boards or sockets easily and quickly.

The lead forming tool includes a split forming rail, precision spacers of preferably 0.100 inch thickness and an adjustable precision roller mounted to each half of the split rail and base plate. The IC package is slid along the top of the forming rail under direct pressure from the operator's finger. As it moves along the rail, all the leads are moved outwardly to a minimum of 15°. The leads then pass through a set of shaped precision rollers, which bend and form the leads to true center line positions of 0.300, 0.400, 0.500, and 0.600 inches. Accomodating to different widths to adapt to the true center line of 0.400, 0.500, and 0.600 inch center is accomplished by inserting the proper number of 0.100 inch thick precision spacers between the two halves of the split rail. Accomodating to the different lateral configurations of the leads where they protrude from the side of the IC package is accomplished by an adjustment means which moves the precision rollers up and down with respect to the top of the split forming rail. Since the tool is operated with one hand and the operator only has to slide the IC package along the top of the split forming rail without physically touching the tool, the tool is totally self-contained which should help to foster widespread acceptance. Further, the minimal contact between the operator and the tool will also minimize tool deterioration in that the tool will stay cleaner and free from deterioration.

DETAILED DESCRIPTION OF THE INVENTION

Figure 1:
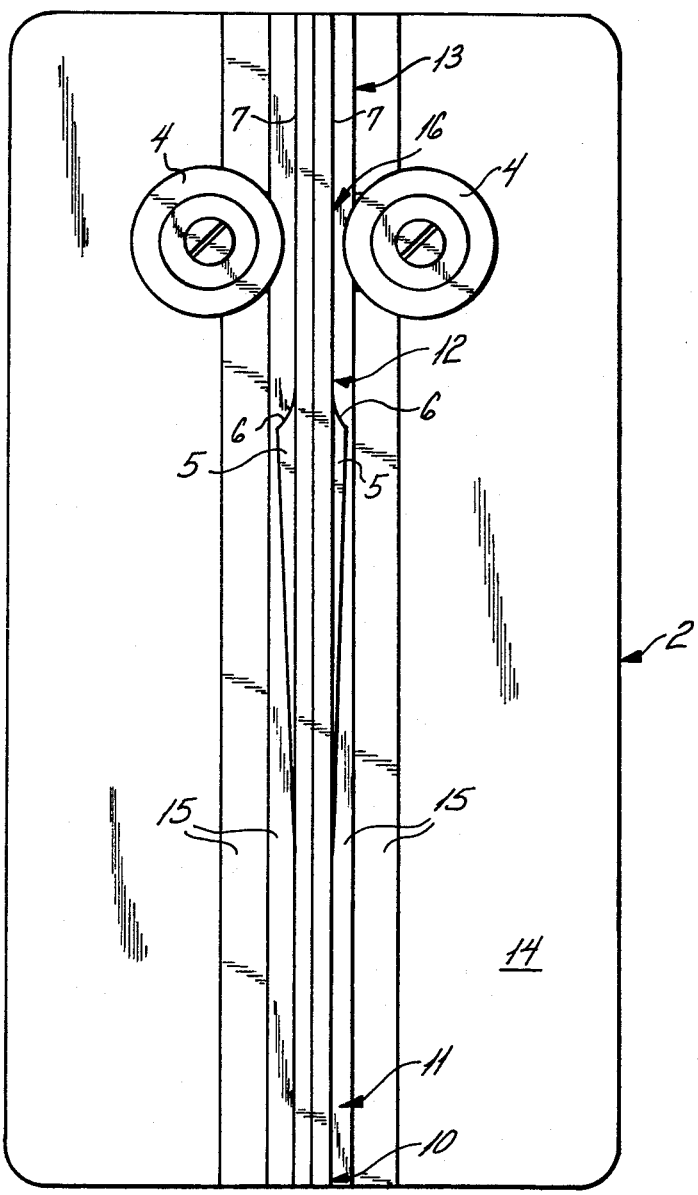
FIGS. 1, 1a, 1b and 1c are a plan view of the universal lead forming tool and three end views of an IC package at these critical positions along the tool, respectively.
Figure 1C:
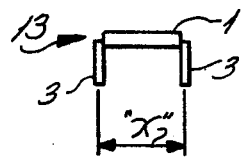
Figure 1B:
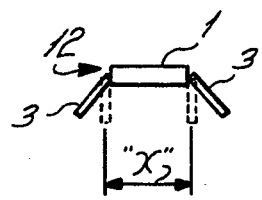
Figure 1D:
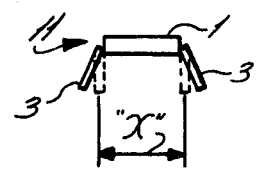

Referring to the Figures, there is shown in FIGS. 1 through 1c an embodiment of my invention in which there is provided an IC package 1 as received from the manufacture of IC packages, which is placed on the lead forming tool 2 at a position 10, where it will appear similar and typical to that shown in FIG. 1a. As the IC1 is guided along a split forming rail 15 to position 12 with the finger of the hand, the leads 3 on each side of the IC chip will be urged outwardly to approximately 15°, as shown in the position identified as 12 in FIG. 1b. As the IC passes through oppositely located precision ball bearing rollers 4—4 (position 16), the leads are formed to true position "X" as shown in FIG. 1c. Dimension "X" refers to 0.300, 0.400, 0.500, and 0.600 inches which are the industry standards today and are merely illustrative of such dimensions.

The leads 3 of the IC ship are forced outwardly between positions 11 and 12 by angulated surfaces 5—5 on opposite sides of the forming rail 15 with the surface being flared from position 11 to position 12. All of the leads are moved outwardly to a uniform angle. The opposite surfaces 5—5 terminate in inwardly curved opposite surfaces 6—6 at approximately point 12 on the forming rail to permit the leads to flex inwardly slightly after being bent outwardly. The inwardly curved surfaces 6—6 terminate in inwardly sloped opposite surfaces 7—7 which are so formed from point 12 to the end of the forming rail.

The precision rollers 4—4 are displaced a slight distance from the opposite parallel surfaces of the forming rail and bend the outwardly flared leads 3 inwardly against surfaces 7—7 (at position 16) to form the true "X" position which is approximately at right angles to the IC chip surface. The leads may flex slightly outward as they pass the rollers due to the normal spring action of such metal leads. The slight inward sloped surfaces 7—7 are formed at approximately 17° ± 3° with respect to a vertical axis.

For further precision bending, the rollers may be provided with a slight downward taper of approximately 5° to the vertical. This minimizes damage to the surface of the leads as they pass between the position rollers and guide rail by ensuring that most of the bending force from the rollers is exerted at the top of the leads 3 to be bent.

As a preferable embodiment, the forming rail and the rollers are formed of heat treatable nickle plated steel to increase their hardness to further ensure the efficacy of the bending process. The nickle plating minimizes contamination which might occur due to operator's tracking the forming rail and rollers. As is well known, the inside face of the leads 3 are abrasive, and the hard nickle plated steel surface of the forming rail can accomplish its bending functions, even under the pressure found with the rollers without damage to its surface. The fit of the leads as they pass between the rollers and forming rail can be accomplished without damage to the forming rail.

Figure 2:
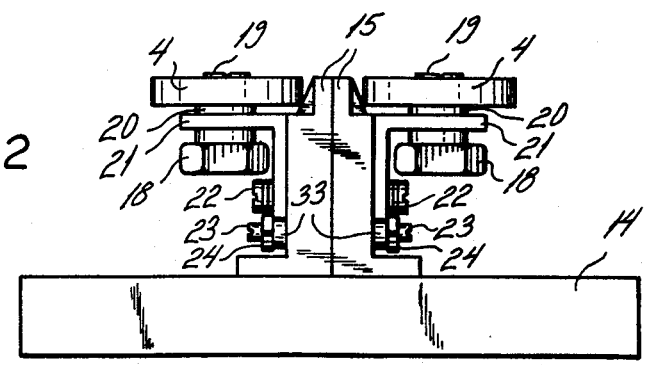
FIG. 2 is an end view of the universal lead forming tool showing the location of the major components when the tool is assembled for the minimum 0.300 inch width IC package.
Figure 3:
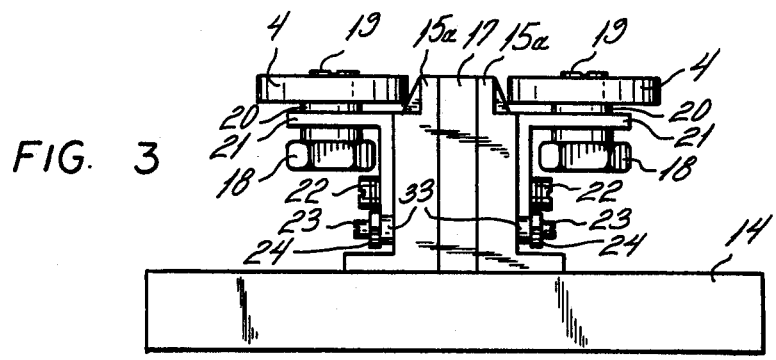
FIG. 3 is an end view of the universal lead forming tool showing one of the precision spacers in place to adjust to a 0.400 inch width IC package.
Figure 4:
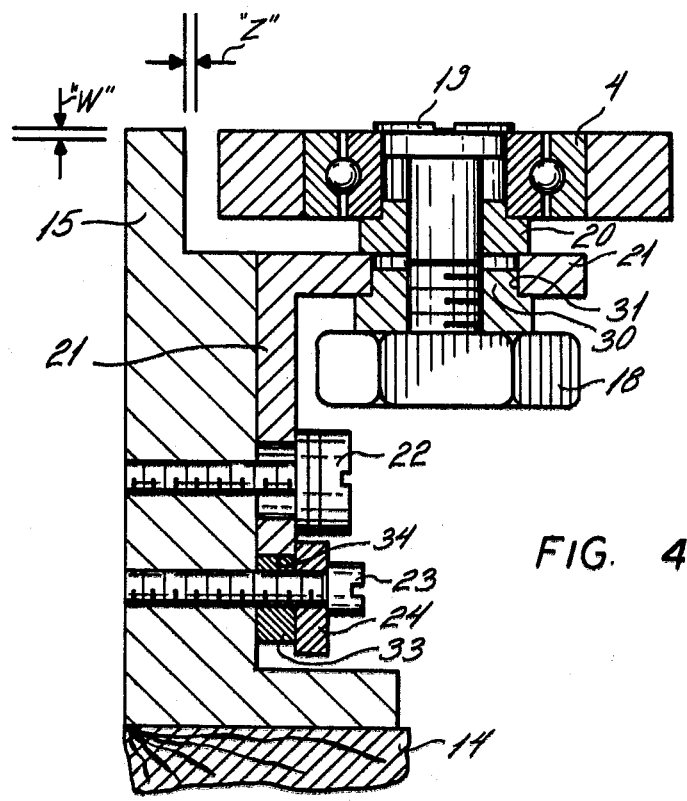
FIG. 4 is a sectional detail end view of the universal lead forming tool showing the adjustment feature for adjusting to the different thicknesses and lateral configurations of the leads on the IC package.

Referring now to FIGS. 2, 3, and 4, there are shown the major components which make up my invention, to be discussed hereinafter.

FIG. 2 is an end view of the tool adjusted for the minimum width of 0.300 inches center line of the IC package.

FIG. 3 is an end view showing a precision shim 17 in place between opposite forming rail segments 15a—15a which adjusts the width of the split forming rail for IC chips whose true center lines are 0.400 inches wide. To adjust for other IC chip widths, one simply adds more precision shims 17.

Figure 4A:
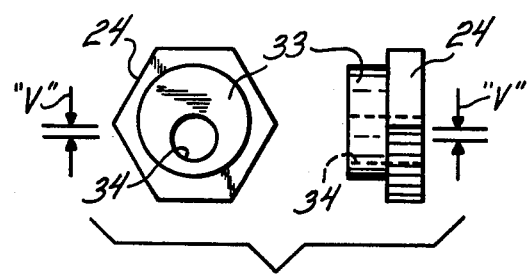
FIGS. 4a and 4b are sectional detail side views of the means to accomodate different lateral configurations and different thicknesses of the leads, respectively.
Figure 4B:
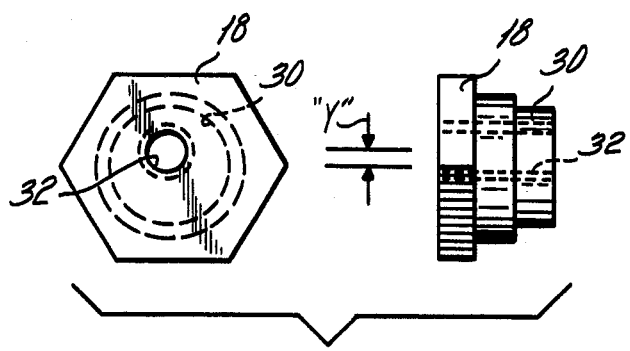
Figure 5:
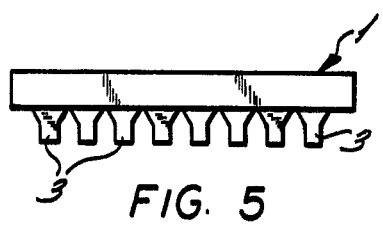
FIG. 5 is a side view of leads of all Dual-In-Line IC packages.
Figure 6A:
FIGS. 6a–6d are end views of different lead configurations of Dual-In-Line IC packages.
Figure 6C:
Figure 6B:
Figure 6D:

FIG. 4 is a sectional view showing the location of the components, which make up the adjustment feature for adjusting to the different thicknesses of the leads on the IC's. The primary element for this adjustment means is an eccentric nut 18, which has a round shoulder 30 (FIG. 4b) that fits into a hole 31 in a mounting bracket 21. The mounting bracket 21 serves as a mount for the precision rollers 4 and their associated adjustment elements. Within shoulder 30 there is a tapped hole 32 which is located off-center by a "Y" dimension which allows a "Z" dimension to be varied as eccentric nut 18 is rotated within the hole 31 located in the mounting bracket 21. An adjusting screw 19 and a spacer 20 have opposite shoulders which are pressed fit into the precision roller 4. To adjust the "Z" dimension, the adjusting nut 18 is loosened from screw 19 and rotated in either direction for the required "Z" dimension. When the proper spacing between the rollers and forming rail is achieved the screw 19 is tightened into the nut 18.

FIG. 4 also shows the location of the components which form the adjustment means for adjusting to the different lateral configurations of the IC packages as shown in FIGS. 6a–6d. The primary element for this adjustment is an eccentric cam 24, which has a round shoulder 33 and a clearance hole 34 (FIG. 4a) which is off-center by a "V" dimension where a clamping screw 23 fits through this "V" dimension allowing a "W" dimension to be varied as cam 24 is rotated about screw 23. To adjust the "W" dimension, a screw 22 is loosened. This screw clamps bracket 21 against forming rail 15. Screw 23 is slightly loosened to permit cam 24 to rotate to a desired "W" dimension. Thereafter, screws 22 and 23 are tightened.

The above invention has been described in some detail, and it is understood that alterations and changes may be made from the specific embodiments disclosed. The embodiment is disclosed merely by way of illustration and is not to limit the scope of protection available for my invention.

I claim:

1. A hand operated tool for automatically straightening leads on an IC chip prior to insertion in an IC socket, said tool comprising
    a forming rail being generally of a rectangular shape having a flat top surface to accomodate the flat bottom surface of the IC chip to facilitate sliding said IC chip along said top surface,
    said forming rail having opposite side surfaces flared outwardly to force the leads on the IC chip outwardly as said chip is slid along said guide rail,
    and roller means located away from opposite sides of said forming rail at distances slightly less than the thickness of said leads to force said leads downwardly against said opposite sides after said leads have been forced outwardly,
    said IC chip being slid off one end of said forming rail with said leads at substantially 90° angles with respect to the plane of said chip and parallel to each other.

2. A hand operated tool as set forth in claim 1 wherein said roller means comprise precision ball bearing rollers with the outer surface of said rollers being tapered inwardly away from the facing side of the forming rail.

3. A hand operated tool as set forth in claim 2 wherein said outer surface of said rollers is tapered inwardly at approximately 7°.

4. A hand operated tool as set forth in claim 1 wherein said forming rail comprises nickel plated hardened steel.

5. A hand tool as set forth in claim 4 wherein said forming rail is longitudinally split into two sections, said sections being movable to accomodate a precision shim, said precision shim adjusting said forming rail to accomodate a larger width IC chip.

6. A hand tool as set forth in claim 1 wherein said outward flared surface of said forming rail terminates in inwardly curved surfaces, said inwardly curved surfaces terminating in substantially vertical opposite side surfaces of said forming rail located at approximately the position of said roller means.

7. A hand tool as set forth in claim 1 wherein said substantially vertical side surfaces comprise inwardly sloped surfaces at approximately 17° with respect to the vertical axis.

8. A hand tool as set forth in claim 1 comprising means for adjusting the lateral position of said rollers with respect to said forming rail to accomodate to different IC chip lead thicknesses.

9. A hand tool as set forth in claim 8 wherein said means for adjusting comprises an eccentric screw mechanism.

10. A hand tool as set forth in claim 1 comprising means for adjusting the horizontal position of said rollers with respect to the top of said forming lead to accomodate to different locations of said leads on said IC chips.

11. A hand tool as set forth in claim 10 wherein said means for adjusting comprises an eccentric cam mechanism.

* * * * *